United States Patent
Natarajan et al.

(10) Patent No.: US 8,182,967 B2
(45) Date of Patent: *May 22, 2012

(54) OPTICAL DATA STORAGE MEDIA AND METHODS FOR USING THE SAME

(75) Inventors: Arunkumar Natarajan, Schenectady, NY (US); Eugene Pauling Boden, Scotia, NY (US); Kwok Pong Chan, Troy, NY (US); Patrick Joseph McCloskey, Watervliet, NY (US); Victor Petrovich Ostroverkhov, Ballston Lake, NY (US); Evgenia Mikhailovna Kim, Ballston Lake, NY (US); David Gilles Gascoyne, Niskayuna, NY (US); Robert James Perry, Niskayuna, NY (US); Riffard Pierre Jean-Gilles, Schenectady, NY (US); Julia Lam Lee, Niskayuna, NY (US); Brian Lee Lawrence, Waunakee, WI (US)

(73) Assignee: General Electric Company, Niskayuna, NY (US)

(*) Notice: Subject to any disclaimer, the term of this patent is extended or adjusted under 35 U.S.C. 154(b) by 303 days.

This patent is subject to a terminal disclaimer.

(21) Appl. No.: 12/550,521

(22) Filed: Aug. 31, 2009

(65) Prior Publication Data

US 2011/0051586 A1    Mar. 3, 2011

(51) Int. Cl.
    *G03H 1/02*  (2006.01)
(52) U.S. Cl. .......... 430/1; 430/2; 430/281.1; 430/286.1; 430/290; 359/3

(58) Field of Classification Search .................. None
    See application file for complete search history.

(56) References Cited

U.S. PATENT DOCUMENTS

| | | |
|---|---|---|
| 5,223,356 A | 6/1993 | Kumar et al. |
| 6,322,931 B1 | 11/2001 | Cumpston et al. |
| 6,402,037 B1 | 6/2002 | Prasad et al. |
| 6,432,610 B1 | 8/2002 | Rentzepis et al. |
| 6,551,682 B1 | 4/2003 | Tosaki et al. |
| 6,947,311 B2 | 9/2005 | Berner et al. |
| 6,969,578 B2 | 11/2005 | Robello et al. |
| 6,969,764 B2 | 11/2005 | Ogiso et al. |
| 7,022,392 B2 | 4/2006 | Dinnocenzo et al. |
| 7,388,695 B2 | 6/2008 | Lawrence et al. |
| 7,452,847 B2 | 11/2008 | Kuboyama et al. |
| 7,459,263 B2 | 12/2008 | Farid et al. |

(Continued)

FOREIGN PATENT DOCUMENTS

EP    1964892    9/2008

(Continued)

OTHER PUBLICATIONS

Hammond et al., "Photosensitized cis-trans isomerization of the stilbenes", JACS vol. 84 pp. 4083-4084 (1962).*

(Continued)

*Primary Examiner* — Martin Angebranndt
(74) *Attorney, Agent, or Firm* — Andrew J. Caruso (57) ABSTRACT

There are provided optical data storage media and methods of optical data storage using the same. The optical data storage media comprises a non-linear sensitizer capable of absorbing actinic radiation to cause upper triplet energy transfer to a reactant that undergoes change upon triplet excitation. The refractive index change ($\Delta n$) of the medium is at least about 0.005, or even at least about 0.05.

16 Claims, 4 Drawing Sheets

U.S. PATENT DOCUMENTS

| | | | |
|---|---|---|---|
| 2005/0019711 A1* | 1/2005 | Takizawa | 430/561 |
| 2005/0136357 A1 | 6/2005 | Farid et al. | |
| 2007/0147214 A1* | 6/2007 | Erben et al. | 369/103 |
| 2008/0144145 A1 | 6/2008 | Boden et al. | |
| 2008/0144146 A1* | 6/2008 | Boden et al. | 359/3 |
| 2008/0247011 A1 | 10/2008 | Lawrence et al. | |
| 2010/0302927 A1* | 12/2010 | Natarajan et al. | 369/103 |
| 2011/0053054 A1* | 3/2011 | Natarajan et al. | 430/2 |
| 2011/0053055 A1* | 3/2011 | Natarajan et al. | 430/2 |
| 2011/0081602 A1* | 4/2011 | Natarajan et al. | 430/2 |

FOREIGN PATENT DOCUMENTS

| | | |
|---|---|---|
| WO | 9821521 | 5/1998 |
| WO | WO2006101873 A2 | 9/2006 |

OTHER PUBLICATIONS

Bron et al., "Near IR two photon induced polymerizations using either benzophenone or thioxanthone based photoinitiators", Polym. Prepr. vol. 42(1) pp. 675-676 (2001).*

Pillai et al. "Electrophotographic charachteristics of copper-phthlocyanaine (CuPh)-polyvinyl cinnimate (PVCn) binder layers", J. Mat. Sci., Lett., vol. 3 pp. 207-209 (1984).*

Dini et al., "Nonlinear Optical Effects Related to Saturable and Reverse Absorption by Subphthalocyanines at 532 nm," Chem. Commun., 2005, pp. 3796-3798.

Rogers et al., "Photophysical Characterization of a Series of Platinum(II)-Containing Phenyl-Ethynyl Oligomers," J. Phys. Chem. A, 2002, pp. 10108-10115.

European Search Report dated Nov. 17, 2010.

* cited by examiner

OPTICAL DATA STORAGE MEDIA AND METHODS FOR USING THE SAME

BACKGROUND

The present disclosure relates to optical data storage media, and more particularly, to holographic storage media as well as methods of making and using the same.

The rapid growth of information technology industry has led to an increasing demand for data storage systems. Optical data storage, wherein reading or writing of data is accomplished by shining light on, e.g., a disk, provides advantages over data recorded in media which must be read by other means, e.g., a magnetically sensitive head for reading magnetic media, or a needle for reading media recorded in vinyl. And, more data can be stored in smaller media optically than can be stored in vinyl media. Further, since contact is not required to read the data, optical media are not as vulnerable to deterioration over periods of repeated use as vinyl media.

Optical data storage media also offer multiple advantages when compared to magnetic storage media. For example, unlike the magnetic disk drives, optical data storage media are most commonly provided as removable media, readily suitable for archiving and backing up data, sharing of content between unconnected systems, and distribution of prerecorded content. Although removable magnetic media, e.g., magnetic tapes, are available, the life-time of information stored on such media is typically limited to 10-12 years, the media are generally rather expensive, and data access is slow. In contrast, optical data storage media can provide the flexibility of removable recordable and/or prerecorded medium, fast data access time, robust inexpensive manufacturing of the media and drives that are affordable enough for consumer computer and entertainment systems.

Nonetheless, conventional optical data storage media does have limitations. First, the storage density of optical media is limited by physical constraints on the minimum size of a recording bit. Another limitation of optical storage is that data is usually stored in one or two discrete layers, either on the surface or sandwiched within the media. Recording the information depth-wise can increase storage capacity, however, methods of doing so, i.e., bleaching and photoreactions, require a large amount of optical power to produce readable marks. As a result, the rate of recording using these conventional 3D recording methods is slow. Further, the media used in these methods typically exhibits a linear response to light energy, and as a result, may require some mechanism to eliminate the sensitivity of the medium to light after the data have been recorded to eliminate unintended erasure, data loss, etc.

Holographic storage is optical data storage in which the data is represented as holograms, which are images of three dimensional interference patterns created by the intersection of two beams of light in a photosensitive medium. More particularly, the superposition of a reference beam and a signal beam, containing digitally encoded data, forms a 3-D interference pattern within the volume of the medium resulting in a chemical reaction that changes or modulates the refractive index of the photosensitive medium. This modulation records both the intensity and phase information from the signal as the hologram. The hologram can later be retrieved by exposing the storage medium to the reference beam alone, which interacts with the stored holographic data to generate a reconstructed signal beam proportional to the initial signal beam used to store the holographic image.

Early attempts at holographic storage relied on a page-based approach, i.e., where the bits of digital information are encoded into volume holograms as two-dimensional arrays of logical zeros and ones that traversed a 'slice' of the necessarily linear media onto which the holograms were recorded. Because a relatively large volume of the media was utilized, the recording and read-out equipment required to utilize a page-based approach can be complex and expensive, and reading or writing within the media is very sensitive to fluctuations in temperature and vibrations, as well as small variations in writing or reading wavelength or intensity.

As a result of these shortcomings, more recent research into holographic data storage has focused on a bit-wise approach, where each bit (or few bits) of information is represented by a hologram localized to a microscopic volume within a medium to create a region that reflects the readout light. Such localized volume holographic micro-reflectors may be arranged into multiple data layers throughout the volume of the medium. In such an arrangement, the readout and recording of data in the layers inevitably leads to exposure of the adjacent layers to the recording/readout radiation, and so, although linear materials have been shown to work for holographic data storage in single bit application, having a media that can support many layers of data without affecting other layers of data during the writing and reading steps would be more advantageous.

Materials capable of accommodating a bit-wise data storage approach are highly sought after as the equipment utilized to read and write to such material is either currently commercially available, or readily provided with modifications to readily commercially available reading and writing equipment. Further, holographic data storage by the bit-wise approach is more robust to temperature, wavelength, intensity variations, and vibration than holographic data stored using the page-based approach. In order to be optimally useful in the recordation of holograms, and in particular, micro-holograms, bit-wise data storage materials must be non-linear and further, will desirably exhibit refractive index change ($\Delta n$) of at least about 0.005 to about 0.05 in response to recording light. Ultimately, the magnitude of the refractive index modulations produced in the material by the recording light will define the diffraction efficiency for a given system configuration, which translates to the signal to noise ratio, bit error rate, and the achievable data density.

Thus, there remains a need for optical data storage media that can exhibit a nonlinear (or "threshold") response to the recording light intensity and that is suitable for bit-wise holographic data storage. In particular, it would be advantageous for holograms stored in the media to be limited in depth so that increased capacity could be realized. It would be further desirable for such data storage media to be written in such a way that refractive index of the surrounding media is not significantly altered and that a substantial degradation of hologram efficiency at various depths is not seen. Desirably, any such materials provided would have sufficient refractive index change to support diffraction efficiencies so as to be capable of recording high-density micro-holographic data, thereby further expanding the storage capacity of the material.

BRIEF DESCRIPTION

An optical data storage medium is provided. The medium comprises a polymer matrix, a reactant capable of undergoing a change upon triplet excitation ($T_n$; $n>1$) and a nonlinear sensitizer capable of absorbing actinic radiation to cause upper triplet-to-triplet energy transfer to said reactant, wherein the refractive index change ($\Delta n$) of the medium is at least about 0.005.

Also provided is an optical data storage medium comprising a polymer matrix, a reactant comprising a cinnamate material and capable of undergoing a change upon triplet excitation and a nonlinear sensitizer comprising a reverse saturable absorber capable of absorbing actinic radiation to cause upper triplet-to-triplet energy transfer to said reactant. The optical data storage medium desirably and advantageously can exhibit a refractive index change ($\Delta n$) of at least about 0.005.

Also provided are methods for optical data storage. The methods comprise providing an optical data storage medium comprising a nonlinear sensitizer and a reactant. The reactant is capable of undergoing a change upon triplet excitation and the non-linear sensitizer capable of absorbing actinic radiation to cause upper triplet-to-triplet energy transfer to said reactant. Further, the optical data storage medium can exhibit a refractive index change ($\Delta n$) of at least about 0.005.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Unless defined otherwise, technical and scientific terms used herein have the same meaning as is commonly understood by one of skill in the art to which this invention belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced item, and the terms "front", "back", "bottom", and/or "top", unless otherwise noted, are merely used for convenience of description, and are not limited to any one position or spatial orientation. If ranges are disclosed, the endpoints of all ranges directed to the same component or property are inclusive and independently combinable (e.g., ranges of "up to about 25 wt. %, or, more specifically, about 5 wt. % to about 20 wt. %," is inclusive of the endpoints and all intermediate values of the ranges of "about 5 wt. % to about 25 wt. %," etc.). The modifier "about" used in connection with a quantity is inclusive of the stated value and has the meaning dictated by the context (e.g., includes the degree of error associated with measurement of the particular quantity).

As used herein, "diffraction efficiency" means a fraction of the beam power reflected by a hologram as measured at the hologram location with respect to the incident probe beam power, while "quantum efficiency" means a probability of an absorbed photon to result in a chemical change that produces a refractive index change. "Fluence" means the amount of optical beam energy that has traversed a unit area of the beam cross-section (measured, for example, in Joule/cm$^2$), while "intensity" means optical radiative flux density, e.g. amount of energy traversing a unit area of beam cross-section in unit time (measured in, for example, Watt/cm$^2$).

There is provided herein optical data storage media suitable for recording microholographic data in a bit-wise approach. The media desirably exhibits a nonlinear response to actinic radiation, i.e., experiences no substantial change in refractive index for incident laser light below a threshold, and significant changes in refractive index above the threshold. Advantageously, while recording into such a medium is only possible with the light having a power, or intensity, exceeding a threshold value, the recorded data can be repeatedly and substantially non-destructively read with light having an intensity below the threshold. Microholograms recorded in the present optical data storage media are expected to be smaller in size than the beam used to record them.

The optical data storage media comprises a non-linear sensitizer and a reactant dispersed within a polymer matrix and can exhibit refractive index change ($\Delta n$) suitable for the recordation of microholograms at high data densities, e.g., at least about 0.005, or at least about 0.05, or even greater. Although other properties can also impact the ability of an optical data storage media to record microholographic data in a bit-wise fashion, such as recording speed, recording intensity, and transparency to name a few, it is believed that the achievable diffraction efficiency and/or refractive index change of a particular media will be controlling in the ability of the media to record microholographic data in a bit-wise fashion. Because of the diffraction efficiencies achievable by the present optical data storage media, the media may be capable of storing about 1 TB of information on a disk comparable in size to a single CD or single DVD.

More particularly, the present media comprises reactants capable of undergoing a change upon triplet excitation ($T_n$; n>1). As used herein, the term "change" is meant to include any indirect photochemical reaction of the reactant, e.g., photodimerization or isomerization. Photodimerization is a bimolecular photochemical process involving an electronically excited unsaturated molecule that undergoes addition with an unexcited molecule of a structurally similar and/or identical species (e.g. two olefins combining to form a cyclobutane ring structure). The covalent bonding that occurs in this reaction produces a new moiety which can be generally classified as a photoproduct. When the word "indirect" is used in conjunction with terms such as photodimerization, photochemical reaction or photoreaction, it means that the reactant did not receive the energy directly from absorption of a photon, but rather from another molecule (such as, e.g., a sensitizer or mediator) that first absorbed the photon and then transferred a portion of that energy to the reactant that subsequently underwent dimerization Examples of reactants suitable for use in some embodiments of the optical data storage media described include, but are not limited to, (i) those that can undergo dimerization so that less volume change is required to go from reactant to product, e.g., reactants that undergo dimerization processes not by direct photoexcitation of the reactant but by indirect "non-radiative energy transfer" (in the present case triplet-to-triplet energy transfer) pathway from the photoexcited sensitizer to the reactant; (ii) those for which a nonlinear sensitizer receives energy from a two-photon process and delivers that energy to one reactant that subsequently condenses with a second reactant to provide a product; (iii) those that, when derivatized on a polymer backbone can provide a very large refractive index change, which corresponds to the available capacity of the material, e.g., a $\Delta n_{max}$ of at least about 0.08 can be achieved if >85% of the reactants are converted to product; and (iv) those that, when derivatized on a polymer backbone, are capable of undergoing both inter- and intramolecular condensation reactions, thereby accelerating the consumption thereof, and providing desired refractive index ($\Delta n$) changes with incident fluence of less than 10 J/cm$^2$ as a result of higher quantum efficiency of the sensitized photo-reaction, which in turn may also provide greater diffraction efficiencies and shorter recording times.

While not wishing to limit the optical data storage medium to the same, one example of a class of materials suitable for use as the reactant in the optical data storage medium, and that provides one or more of the above delineated changes to the same, are cinnamate materials, cinnamate derivatives and cinnamamide derivatives. Any cinnamate materials may be used, and those of ordinary skill in the art are aware of many suitable for use in the optical data storage medium. In some embodiments, cinnamate materials that are capable of undergoing [2+2] indirect photodimerization and indirect photopolymerization may be used, due to their transparency (negligible UV absorption) at 405 nm or 532 nm in order to keep the linear bleaching of the cinnamate to a minimum and facilitate only the triplet-triplet energy transfer from the excited sensitizer. In some embodiments, the cinnmamate materials will desirably comprise polyvinylcinnamates (PVCm) with cinnamate content of the polyvinyl backbone varying between about 54 wt % to about 75 wt % based upon the total weight of the polyvinylcinnamate.

Examples of polyvinylcinnamates, cinnamate derivatives and cinnamamide analogs include, but are not limited to, polyvinylcinnamate (PVCm), polyvinyl 4-chlorocinnamate (PVClCm), polyvinyl 4-methoxycinnamate (PVMeOCm), (2E,2'E)-((1S,2S)-cyclohexane-1,2-diyl)bis(3-phenylacrylate), (2E,2'E)-(1S,2S)-cyclohexane-1,2-diyl)bis(4-chlorophenylacrylate), (2E,2'E)-(1S,2S)-cyclohexane-1,2-diyl)bis(4-methoxyphenyl)acrylate). (2E,2'E)-N,N'-((1S,2S)-cyclohexane-1,2-diyl)bis(3-phenyl)acrylamide (2E,2'E)-N,N'-((1S,2S)-cyclohexane-1,2-diyl)bis(3-(4-chlorophenyl) acrylamide), (2E,2'E)-N,N'-((1S,2S)-cyclohexane-1,2-diaryl)bis(3-(4-methoxyphenyl)acrylamide). These are shown below:

Where R═H or Cinnamate
X═H (Polyvinylcinnamate(PVCm),
OMe (Polyvinyl 4-methoxycinnamate (PVMeOCm), or
Cl (Polyvinyl 4-chlorocinnamate (PVClCm))
Where X=(para)-H: (2E,2'E)-((1S,2S)-cyclohexane-1,2-diyl)bis(3-phenylacrylate) or
X=(para)-Cl: (2E,2'E)-((1S,2S)-cyclohexane-1,2-diyl)bis(3-(4-chlorophenyl)acrylate) or
X=(para)-MeO: (2E,2'E)-((1S,2S)-cyclohexane-1,2-diyl)bis(3-(4-methoxyphenyl)acrylate)
Where X=(para)-H: (2E,2'E)-N,N'-((1S,2S)-cyclohexane-1,2-diyl)bis(3-phenyl)acrylamide) or
X=(para)-Cl: (2E,2'E)-N,N'-((1S,2S)-cyclohexane-1,2-diyl)bis(3-(4-chlorophenyl)acrylamide) or
X=(para)-MeO: (2E,2'E)-N,N'-((1S,2S)-cyclohexane-1,2-diyl)bis(3-(4-methoxyphenyl)acrylamide)

Figure 3:
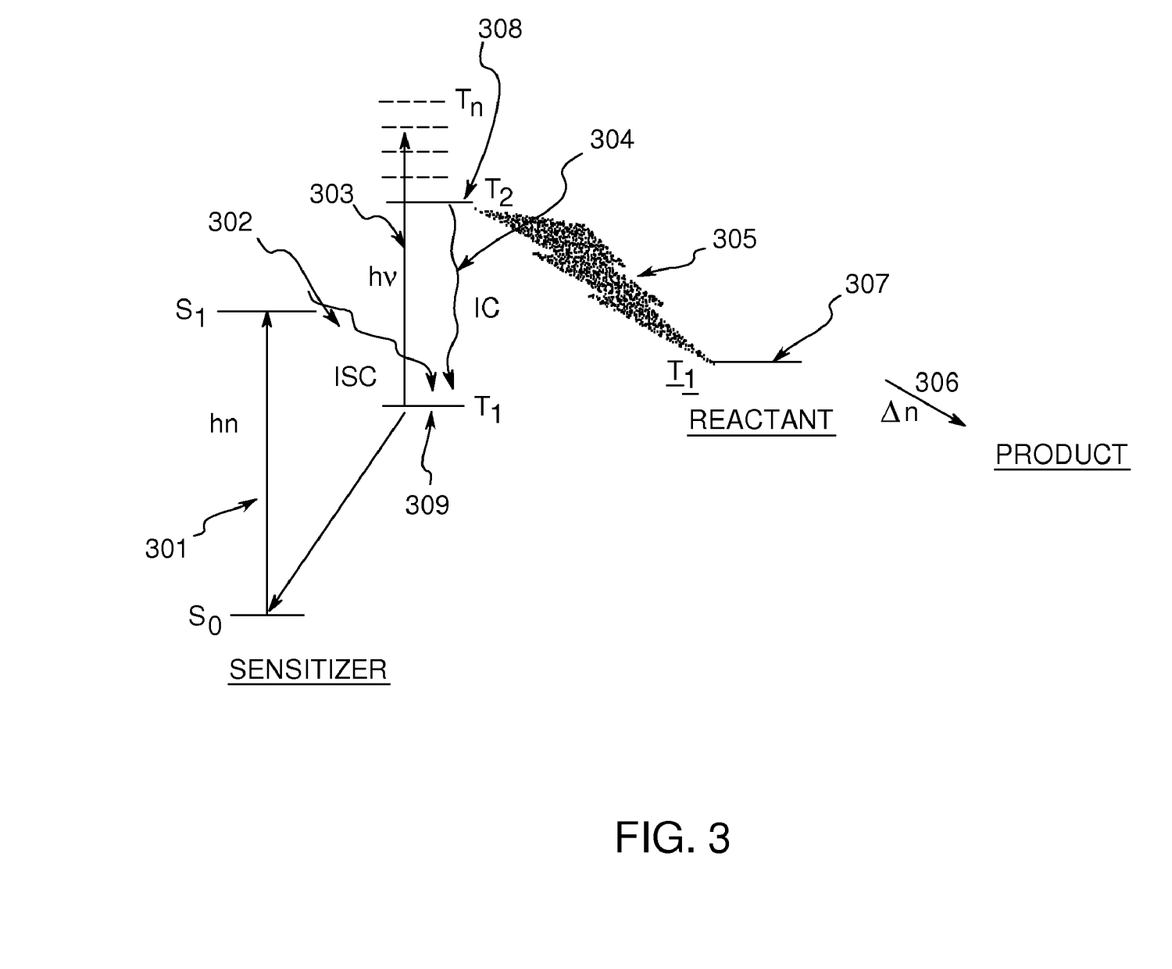
FIG. 3 is a schematic energy level diagram showing the upper triplet $T_n$ excited state absorption and resulting energy transfer for a sensitizer exhibiting reverse saturable absorption.

In one embodiment, the reactant(s) utilized in the present optical data storage media are capable of undergoing a change upon triplet excitation. Referring to FIG. 3, the reactants used in the present optical data storage media have a triplet energy denoted by arrow 307 below that of the $T_2$ state of the sensitizer denoted by arrow 308, but above that of the $T_1$ state of the sensitizer, shown at arrow 309. The reactants are also capable of receiving energy from an upper triplet state ($T_2$ or higher) of the sensitizer, and undergoing a reaction to form a product, which provides a refractive index change within the polymer matrix and thus, a recorded hologram.

In addition to the aforementioned benefits, the use of such materials as the reactant in the optical data storage media described herein may also provide the possibility of a higher loading when derivatized on a polymer backbone than conventional reactants. That is, whereas loading of conventional reactants when derivatized on a polymer backbone may be limited to no more than about 30 wt %, the novel reactants described here can be loaded onto polymer backbones at much greater loadings, i.e., even up to about 90 wt %, based upon the total weight of the optical data storage media.

Also, the use of the reactants provided herein provide a significant decrease in birefringence as compared to conventional reactants. Finally, the optical recording media described provides the ability to rapidly create high-resolution micro-holograms with minimal heat formation and signal leakage to neighboring locations that can result in smearing of the captured holographic pattern.

The reactant is usually present in relatively high concentrations both to yield large changes in optical properties within the polymer matrix and to promote efficient triplet energy transfer. For example, the reactant may be present in the optical data storage media in amounts of from about 2 weight % to about 80 weight %, based upon the total weight of the optical data storage media.

The reactant may be covalently attached, or otherwise associated with, the polymer matrix. For example, polymers functionalized with cinnamates may be utilized as the polymer matrix, and e.g., polyvinyl cinnamates are readily commercially available. In this case, the optical data storage media may comprise higher loading amounts of the reactants, e.g., up to about 90 weight %, based upon the total weight of the optical data storage media.

In addition to the reactants described above, the present optical data storage media desirably comprises one or more non-linear sensitizers. The non-linear sensitizers are capable of absorbing incident actinic radiation, e.g., in the form of one or more photons, and then transferring the energy to the reactant molecule to induce a molecular rearrangement of the reactant into a product that, in turn, gives rise to modulations in the refractive index of the medium. This modulation records both the intensity and phase information from the incident actinic radiation as the hologram. The advantages of the use of nonlinear (or "threshold") sensitizers as opposed to linear sensitizers can be further understood with references to FIGS. 1A, 1B, and 2.

Figures 1A, 1B:
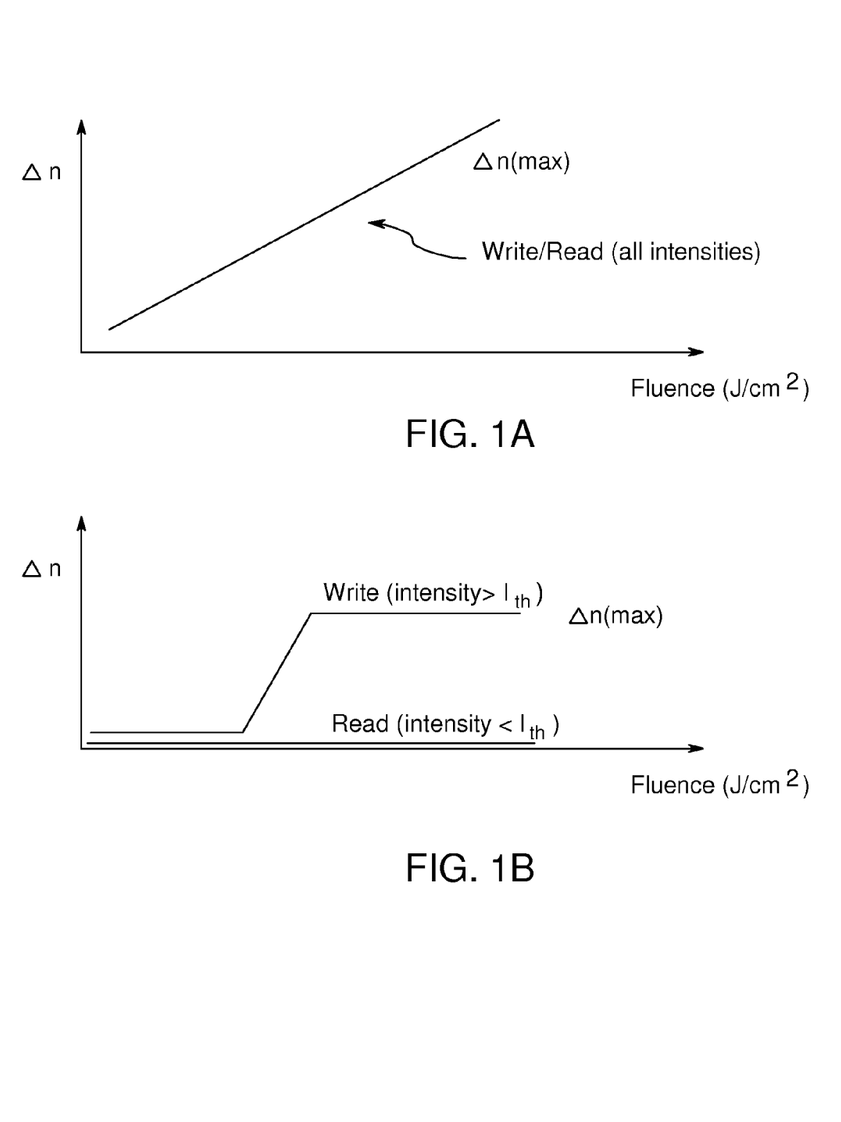
FIG. 1A is a graphical depiction of the response of a linear sensitizer to actinic radiation.
FIG. 1B is a graphical depiction of the response of a threshold sensitizer to actinic radiation.

More specifically, FIG. 1A shows the response of a linear photosensitive material to incident actinic radiation, while FIG. 1B shows the response of a threshold material to incident actinic radiation. As is shown in FIG. 1A, linear photosensitive materials will cause a reaction at any power density (intensity) of recording light and the amount of the refractive index change ($\Delta n$) achieved will be the same for the same radiative energy (fluence) received by the material. In contrast, threshold materials will only cause a reaction at and over a certain light intensity of recording light.

Figure 2:
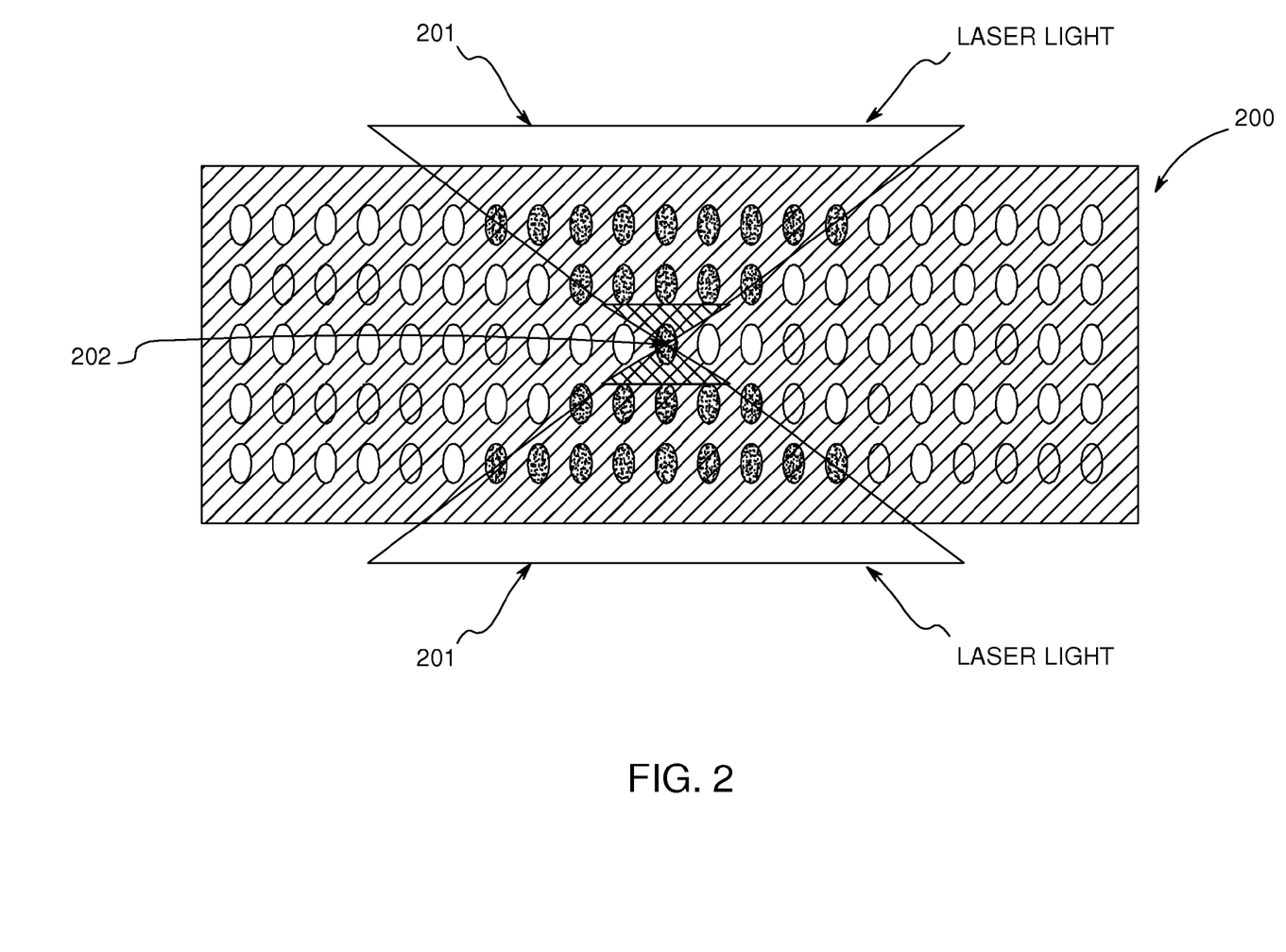
FIG. 2 is a cross-sectional view of an optical storage media, showing the area of impact of actinic radiation if the media comprises a linear sensitizer and the area of impact of actinic radiation if the media comprises a threshold sensitizer.

As a result, and as is shown in FIG. 2, in optical data storage media 200 comprising linear photosensitive materials, consumption of dynamic range will occur in non-addressed volumes, substantially everywhere actinic radiation passes through, shown as sections 201. In contrast, if data storage media 200 comprises threshold materials, consumption of dynamic range in non-addressed volumes is reduced or eliminated and consumption will occur substantially only in the target volume, i.e., at the focal point 202 of the actinic radiation. The use of threshold materials in the present optical data storage medium thus facilitates recording into a layer of bit-wise data buried in the bulk of the medium without disruption of adjacent layers of previously recorded data or vacant space available for subsequent recording. Also, as the light intensity in a tightly focused laser beam varies dramatically through the depth of the focal spot and is usually at its maximum at the beam waist (narrowest cross section), the threshold response of the medium will naturally restrict material conversion to occur only in the immediate vicinity of the beam waist. This may lead to a reduction in microhologram size within each layer, thus facilitating an increase in layer data storage capacity of the present media, so that the overall data storage capacity of the media may also be increased. The data storage media will also advantageously be substantially stable in ambient light, so that exposure to the same does not result in substantial deterioration or damage to the media.

The nonlinear sensitizers used in the present optical data storage media are capable of transferring energy from an upper triplet state ($T_n$, wherein n>1), which has a very short lifetime (nanoseconds to a few µ (micro) seconds), to the reactant. The ability to transfer energy from the $T_n$ state provides the optical storage media provided herein with its nonlinear, threshold properties. That is, $T_n$ excited state absorption is only appreciable when the sensitizer is excited by high-intensity light, e.g., light having an intensity at least 2 orders of magnitude or more greater than ambient light, and negligibly small when subjected to low-energy radiation. This allows for the present optical data storage media, comprising the nonlinear sensitizers, to remain substantially transparent and inert to low intensity radiation, e.g., reading or ambient light, and to only change its properties (absorbance and thus, refractive index) in response to high energy recording light at or near the focal points. As a result, the present optical data storage media exhibits the threshold behavior desired and/or necessary for the bit-wise recordation of microholographic data.

FIG. 3 is a schematic energy level diagram showing the upper triplet $T_n$ excited state absorption and resulting energy transfer for a sensitizer exhibiting reverse saturable absorption. As shown in energy level diagram 300, arrow 301 illustrates the ground state absorption cross section of a photon as it transitions from the singlet ground state $S_0$ to a first excited state $S_1$. The intersystem-crossing rate, represented by arrow 302, signifies the transfer of energy that occurs when the sensitizer moves from an excited singlet state $S_1$ to a corresponding triplet state $T_1$. Arrow 303 indicates the excited triplet state absorption cross section. Once the upper level triplet state $T_n$ is achieved by subsequent linear absorption, two upper excited decay processes are possible. One possible decay process, denoted by arrow 304 in FIG. 3, is the non-radiative relaxation by internal conversion (IC) to the lower lying $T_1$ state. The other possible decay process is denoted by arrow 305 in FIG. 3, and involves the release of energy from the sensitizer and the transfer of this energy to the reactant via triplet-triplet energy transfer. The reactant then undergoes a change denoted by arrow 306 to form the holographic grating and record the data. The change in this case is a chemical reaction, and more particularly, a bimolecular photochemical process involving a cinnamate molecule electronically excited to its triplet state undergoes addition with a unexcited or a ground state cinnamate molecule to form a cyclobutane ring structure.

In some embodiments, the present nonlinear sensitizers may absorb two photons, typically, sequentially. Also, once the sensitizers described herein transfer the absorbed energy to the reactant (as shown at 305 in FIG. 3), they return to their original state, and may repeat the process many times over. The sensitizers thus do not get substantially consumed over time, although their ability to absorb energy and release it to one or more reactants may degrade over time. This is in contrast to materials known conventionally as photosensitive materials, which can absorb energy (typically a single photon) and not transfer it to other molecules, but undergo conversion to a new structure, or react with another molecule to form a new compound in so doing.

In one embodiment, the nonlinear sensitizers comprise reverse saturable absorbers (RSAs). For the purposes of this application, a reverse saturable absorber (RSA) is a compound that has extremely low linear absorption at a given wavelength (such as 532 or 405 nm) and transmits nearly all of the light. However, when subjected to high intensity laser power at these given wavelengths, low level linear absorption can lead to a state where the molecule has a higher absorption cross section and becomes highly absorbing at that same wavelength; causing it to strongly absorb subsequent photons. This nonlinear absorption is often referred to as sequential two-photon absorption. Examples of RSAs suitable for use in the present optical data storage media are disclosed in Perry et al., "Enhanced reverse saturable absorption and optical limiting in heavy atom-substituted pthalocyanines", Optics Letters, May 1, 1994, Vol. 19, No. 9, pages 625-627, hereby incorporated by reference herein in its entirety.

Many RSAs experience photoexcitation when impinged upon by incident actinic radiation having a wavelength of 532 nm. Because this wavelength is within the green color portion of the visible spectrum, these RSA's may typically be referred to as "green" RSA's. Any of these green RSA's that are capable of entering into the upper triplet ($T_2$) state upon photoexcitation may be utilized in the present optical data storage media. Examples of green RSAs include metal/ligand complexes, such as phthalocyanines, naphthalocyanines or porphyrins; fullerenes; or transition metal cluster compounds, including transition metals, group IIA-VIA metals, and/or rare earth metals. In some embodiments, phthalocyanines and porphyrins, and in particular those comprising indium, lead, copper or zinc, may be used. Preferred phthalocyanines, include, for example, lead(II)tetrakis(4-cumylphenoxy)phthalocyanine, copper(II)tetrakis(4-cumylphenoxy)pthalocyanine, zinc 2,9,16,23-tetra-tert-butyl-29H,31H-phthalocyanine or indium 2,9,16,23-tetra-tert-butyl-29H-31H-phthalocyanine.

Lesser known are RSA's capable of undergoing photoexcitation upon impingement with incident actinic radiation at a wavelength of 405 nm, or "blue" RSA's. Several new RSA's have been recently discovered and are disclosed in U.S. patent application Ser. Nos. 12/551,410, and 12/551,455, attorney docket numbers 236639-1 and 236540-1, respectively, filed concurrently herewith, and incorporated herein by reference in their entirety for any and all purposes, so long as not directly contradictory with the teachings herein. Generally speaking, these new blue RSA's include subphthalocyanines, and platinum ethynyl based dyes, specific examples of which include, but are not limited to 3,5-dibromophenoxysubphthalocyaninato]boron(III), 3-iodophenoxysubphthalocyaninato]boron(III), trans-Bis(tributylphosphine)bis(4-ethynyl-biphenyl)platinum (PPE), trans-Bis(tributylphosphine)bis(4-ethynyl-1-(2-phenylethynyl)benzene)platinum (PE2).

Of course, these are exemplary, and many more varieties of reverse saturable absorbing molecules, or other molecules exhibiting non-linear absorption, may be used in the optical data storage media disclosed herein.

The amount of nonlinear sensitizer used in the optical data storage media can depend on its optical density at the wavelength of light used to record the hologram. Solubility of the sensitizer may also be a factor. Generally speaking, the sensitizer may be used in an amount of from about 0.002 weight % to about 5 weight % based upon the total weight of the data storage media.

In some embodiments, photostabilizers may also be included in the optical data storage media described herein, in order to assist in the photostabilization of the non-linear sensitizer utilized therein. Those of ordinary skill in the art are aware of compounds/materials useful for this purpose, and useful amounts of these, and any of these may be used, in any suitable amount. One exemplary compound that may assist in the photostabilization of, e.g., a phthalocyanine dye, includes bisdithiobenzil nickel.

Optionally, the data storage media may further comprise a mediator to assist in upper triplet energy transfer from the sensitizer to the reactant. The triplet state ($T_{1m}$) of the mediator will desirably be (a) below the triplet state ($T_n$; n>1) of the sensitizer but above the $T_1$ of the sensitizer and (b) above the triplet state ($T_{1r}$) of the reactant, or ideally between about 50 kcal/mol and 90 kcal/mol.

Examples of suitable mediators include, but are not limited to, acetophenone ($T_1 \approx 78$ kcal/mol), dimethylphthalate ($T_1 \approx 73$ kcal/mol), propiophenone ($T_1 \approx 72.8$ kcal/mol), isobutyrophenone ($T_1 \approx 71.9$ kcal/mol), cyclopropylphenylketone ($T_1 \approx 71.7$ kcal/mol), deoxybenzoin ($T_1 \approx 71.7$ kcal/mol), carbazole ($T_1 \approx 69.76$ kcal/mol), diphenyleneoxide ($T_1 \approx 69.76$ kcal/mol), dibenzothiophene ($T_1 \approx 69.5$ kcal/mol), 2-dibenzoylbenzene ($T_1 \approx 68.57$ kcal/mol), benzophenone ($T_1 \approx 68$ kcal/mol), polyvinylbenzophenone ($T_1 \approx 68$ kcal/mol), 1,4-diacetylbenzene ($T_1 \approx 67.38$ kcal/mol), 9H-fluorene ($T_1 \approx 67$ kcal/mol), triacetylbenzene ($T_1 \approx 65.7$ kcal/mol), thioxanthone ($T_1 \approx 65.2$ kcal/mol), biphenyl ($T_1 \approx 65$ kcal/mol), phenanthrene ($T_1 \approx 62$ kcal/mol), phenanthrene ($T_1 \approx 61.9$ kcal/mol), flavone ($T_1 \approx 61.9$ kcal/mol), 1-napthonitrile ($T_1 \approx 57.2$ kcal/mol), poly(β-naphthoylstyrene) ($T_1 \approx 55.7$ kcal/mol), Fluorenone ($T_1 \approx 55$ kcal/mol), and combinations of these.

If utilized, the mediator may, if desired, be covalently attached to, or otherwise associated with, the polymer matrix. Incorporating the mediator into the polymer matrix in this way can allow for higher concentrations of the mediator to be utilized, which, in turn, can increase recording efficiency of the data storage media.

The amount of mediator used, if any, should not be so much as to cause self-quenching, i.e., when two triplets of the mediator meet each other to generate a singlet state and a ground state of the mediator. Optimal amounts of any mediator may also depend on the particular sensitizer. Bearing such considerations in mind, useful concentrations of the mediator can range from about 1 weight % to about 20 weight % if dispersed within the polymer matrix, and from about 2 weight % to about 50 weight % if covalently attached to the polymer matrix.

The desired sensitizer and reactant may be substantially uniformly dispersed through a polymer matrix, or may be dispersed in any fashion so that bit-wise data recordation is facilitated within the medium. The polymer matrix may comprise a linear, branched or cross-linked polymer or co-polymer. Any polymer may be used so long as the sensitizer and reactant can be substantially uniformly dispersed therein. Further, any polymer utilized will desirably not substantially interfere with the upper triplet energy transfer process. The polymer matrix may desirably comprise a polymer that is optically transparent, or at least has a high transparency at the wavelength contemplated for recording and reading the optical data storage medium.

Particular examples of suitable polymers for use in the polymer matrix include, but are not limited to, poly(alkyl methacrylates), such as poly(methyl methacrylate) (PMMA), polyvinyl alcohols, poly(alkyl acrylates), polystyrenes, polycarbonates, poly acrylates, poly(vinylidene chloride), poly (vinyl acetate), and the like. As mentioned above, the sensitizer may also be covalently attached, or otherwise associated with, the polymer matrix. For example, polymers such as polyesters, polycarbonates and polyacrylates including stilbene are readily available, or, are readily functionalized to include stilbene units.

The polymer matrix may also contain a plasticizer, such as dibutyl phthalate, dibutyl sebacate or di(2-ethylbexy) adipate. Plasticizers can enhance recording efficiencies by facilitating molecular motion. Typical plasticizer levels can range from about 1 weight % to about 20 weight %, based upon the total weight of the storage media, or from about 2 weight % to about 10 weight %.

The optical data storage media described herein may be in a self-supporting form. Or, the data storage media may be coated onto a support material, such as polymethyl(methacrylate) (PMMA), polycarbonate, poly(ethylene terephthalate), poly(ethylene naphthalate), polystyrene, or cellulose acetate Inorganic support materials such as glass, quartz or silicon may also be used, in those embodiments wherein use of a support material may be desired.

In such embodiments, the surface of the support material may be treated in order to improve the adhesion of the optical data storage media to the support. For example, the surface of the support material may be treated by corona discharge prior to applying the optical data storage media. Alternatively, an undercoating, such as a halogenated phenol or partially hydrolyzed vinyl chloride-vinyl acetate copolymer can be applied to the support material to increase the adhesion of the storage media thereto.

Generally speaking, the optical data storage media described herein can be prepared by blending the desired sensitizer, reactant, mediator (if desired) and polymer matrix. Proportions of these may vary over a wide range, and the optimum proportions and methods of blending may be readily determined by those of ordinary skill in the art. For example, the sensitizer may be present in concentrations of from about 0.01 weight % to about 90 weight %, and the reactant may be present in concentrations of from about 2 weight % to about 80 weight %, or even up to about 90 weight %, based upon the total weight of the optical data storage media.

Sample Preparation

Thin film samples for demonstrating microholograms and recording the reflectivity after writing microholograms were prepared as follows:

EXAMPLE 1

Phthalocyanine/polyvinylcinnamate (PVCm). 1 g of PVCm containing 68 wt % cinnamate (MW 100,000) will be dissolved in 1:1 dichloroethane/methylene chloride. 10 mg (1 wt %) of InPc (Indium 2,9,16,23-tetra-tert-butyl-29H-31H-phthalocyanine) dye will be added and the materials dissolved by stirrer accompanied by heating on a hot plate maintained at 70° C. The solution will then be filtered using a 0.450 mm syringe filter and the filtered solution poured into a glass rim (5 cm diameter) on a glass plate setup and dried on a hot plate maintained at 45° C. for 12 hours and at 75° C. overnight. After drying on a hot plate, the films will be removed from the glass plates and dried in vacuum at 70° C. for 6 hours.

EXAMPLE 2

Phthalocyanine/polyvinylcinnamate (PVCm). 1 g of PVCm containing 68 wt % cinnamate (MW 100,000) will be dissolved in 1:1 dichloroethane/methylene chloride. 2 wt % of ZnPc (Zinc 2,9,16,23-tetra-tert-butyl-29H-31H-phthalocyanine) dye will be added and the materials dissolved by stirrer accompanied by heating on a hot plate maintained at 70° C. The solution will then be filtered using a 0.450 mm syringe filter and the filtered solution poured into a glass rim (5 cm diameter) on a glass plate setup and dried on a hot plate maintained at 45° C. for 12 hours and at 75° C. overnight. After drying on a hot plate, the films will be removed from the glass plates and dried in vacuum at 70° C. for 6 hours.

EXAMPLE 3

Subphtalocyanine/polyvinylcinnamate (PVCm). 1 g of PVCm containing 68 wt % cinnamate (MW 100,000) was dissolved in 1:1 dichloroethane/methylene chloride. 1.3 wt % of diBrSubPc (3,5-dibromophenoxysubphthalocyaninato] boron(III)) was added and the materials dissolved by stirrer accompanied by heating on a hot plate maintained at 70° C. The solution was then filtered using a 0.450 mm syringe filter and the filtered solution poured into a glass rim (5 cm diameter) on a glass plate setup and dried on a hot plate maintained at 45° C. for 12 hours and at 75° C. overnight. After drying on a hot plate, the films were removed from the glass plates and dried in vacuum at 70° C. for 6 hours.

EXAMPLE 4

Subphtalocyanine/polyvinylcinnamate (PVCm). 1 g of PVCm containing 68 wt % cinnamate (MW 100,000) was dissolved in 1:1 dichloroethane/methylene chloride. 1.3 wt % of 3IPhOSubPc (3-iodophenoxysubphthalocyaninato]boron (III)) was added and the materials dissolved by stirrer accompanied by heating on a hot plate maintained at 70° C. The solution was then filtered using a 0.450 mm syringe filter and the filtered solution poured into a glass rim (5 cm diameter) on a glass plate setup and dried on a hot plate maintained at 45° C. for 12 hours and at 75° C. overnight. After drying on a hot plate, the films were removed from the glass plates and dried in vacuum at 70° C. for 6 hours.

EXAMPLE 5

Platinum Ethynyl/polyvinylcinnamate (PVCm). 1 g of PVCm containing 68 wt % cinnamate (MW 100,000) was dissolved in 1:1 dichloroethane/methylene chloride. 0.5 wt % of PPE (trans-Bis(tributylphosphine)bis(4-ethynylbiphenyl) platinum) was added and the materials dissolved by stirrer accompanied by heating on a hot plate maintained at 70° C. The solution was then filtered using a 0.450 mm syringe filter and the filtered solution poured into a glass rim (5 cm diameter) on a glass plate setup and dried on a hot plate maintained at 45° C. for 12 hours and at 75° C. overnight. After drying on a hot plate, the films were removed from the glass plates and dried in vacuum at 70° C. for 6 hours.

EXAMPLE 6

Platinum Ethynyl/polyvinylcinnamate (PVCm). 1 g of PVCm containing 68 wt % cinnamate (MW 100,000) was dissolved in 1:1 dichloroethane/methylene chloride. 1.5 wt % of PE2 (trans-Bis(tributylphosphine)bis(4-ethynyl-1-(2-phenylethynyl)benzene)platinum) was added and the materials dissolved by stirrer accompanied by heating on a hot plate maintained at 70° C. The solution was then filtered using a 0.450 mm syringe filter and the filtered solution poured into a glass rim (5 cm diameter) on a glass plate setup and dried on a hot plate maintained at 45° C. for 12 hours and at 75° C. overnight. After drying on a hot plate, the films were removed from the glass plates and dried in vacuum at 70° C. for 6 hours.

Microhologram Recording

Experimental demonstration of μ-hologram recording in the present optical data storage media was performed using a micro-holographic static tester system.

532 nm Apparatus. The 532 nm system comprises a continuous-wave (CW) (<50 mW) laser and a Q-switched (5 ns, <10 mJ/pulse) laser, both operating at 532 nm. The dimensions of the beams were set to produce a focused beam with numerical aperture (NA) of 0.2, resulting in the approximated dimensions of the recording volume to be 1.6×1.6×14 μm. The pulsed laser was used as the writing source, as the short duration of the light pulse allowed one to achieve light intensity values of hundreds of $MW/cm^2$ to several $GW/cm^2$ at the focal spot of such focused recording beam. The CW laser was used as the probe due to easier detection of the continuous light source. Both 532 nm lasers have long coherence lengths (>1 m), which ensures high-contrast interference patterns at the sample without need of path length compensation if they are used for recording. The CW and pulsed laser beams were coupled into the same optical pass using polarization so that either of the beams can be used for recording or readout. Pulsed exposure was controlled via a fast mechanical shutter that operated synchronized to the pulsed laser cycle to allow a single or few multiple pulses to pass through toward the medium upon recording.

405 nm Apparatus. A tunable optical parametric oscillator system operating at the 405 nm wavelength was used as a pulsed light source for recording and readout of micro-holograms. The light was focused into the medium sample using optics with numerical aperture (NA) of 0.16, resulting in the approximate dimensions of the recording volume to be 1.6× 1.6×17 μm. The pulse energies used for micro-hologram recording were between 10 s to 100 s of nano-Joules, which allowed one to achieve light intensity values of hundreds of $MW/cm^2$ to several $GW/cm^2$ at the focal spot of such focused recording beam. The readout of the light reflected from micro-holograms was done using the same beam attenuated by approximately 100-1000× with respect to the recording power.

Using the system appropriate for the sensitizer, the recording of μ-holograms in the optical data storage media was performed by two high-intensity counter-propagating pulsed recording beams focused and overlapped in the bulk of the recording medium to produce the intensity fringe pattern consisting of light and dark regions (fringes). The illuminated regions of the interference pattern undergo a change as described above, which results in a locally modified refractive index of the material, while the dark regions remain intact, thus creating a volume hologram. The present threshold optical data storage media is sensitive to a high-intensity light and is relatively inert to the low-intensity radiation. The power of the recording beam was adjusted so that the light intensity near the focal region of the beam is above the recording threshold (above which the change readily occurs), while remaining low outside the recordable region away from the focal spot of the beam, thus eliminating unintended media modification (recording or erasure).

During μ-hologram recording, the primary recording beam was split into the signal and the reference using a half-wave plate (λ/2) and a first polarization beam splitter. The two secondary beams were steered to the sample in a counter-propagating geometry and were focused to overlap in the bulk of the optical data storage media by identical aspheric lenses with a numerical aperture (NA) of up to 0.4. The polarization of both beams was converted into circular polarization—with two quarter-wave plates (λ/4) to ensure that the beams interfere to create a high-contrast fringe pattern. The sample and the signal beam lens were mounted on closed-loop three-axis positioning stages with 25 nm resolution. A position-sensitive detector on the reference side of the sample was used to align the signal lens for optimized overlap of the focused signal and reference beams in the medium, and thus, optimized recording.

A variable attenuator and the half-wave plate/PBS assembly were used to control the power level during recording and/or read-out. This allows the μ-holographic recording characteristics of the optical data storage media to be measured as a function of the recording power and/or energy. This functional dependence distinguishes between a linear optical data storage medium/recording, where the strength of the recorded hologram is largely defined by the total amount of light energy received by the medium, but is independent of the light intensity, and a nonlinear, threshold optical data storage medium/recording, where the recording efficiency is highly dependent upon the intensity of the light. In a linear medium, a small exposure results in a low-strength hologram, which gradually grows with higher exposures. In contrast, in a nonlinear, threshold medium, recording is only possible with intensity exceeding the threshold value.

During read-out, the signal beam was blocked, and the reference beam was reflected by the μ-holograms in the direction opposite to the incident direction. The reflected beam was coupled out from the incident beam path using the quarter-wave plate and a second polarizing beam splitter, and was collected on a calibrated photodiode in a confocal geometry to provide an absolute measure of the diffraction efficiency. By translating the sample with respect to the readout optics, it was possible to obtain a 3D profile of a micro-hologram diffraction response and evaluate dimensions of a microhologram.

Examples 1 and 2 utilize sensitizers functional at approximately 532 nm, therefore the performance will be evaluated using the 532 nm apparatus. For examples 1 and 2, it is expected that the optical data storage medium will exhibit diffraction efficiencies of at least about 0.05, or from about 0.05 to about 15% at NA=0.2, depending on the recording fluence. It is further expected that optical data storage media according to examples 1 and 2 will exhibit refractive index changes of at least about 0.005, or even about 0.05.

Figure 4:
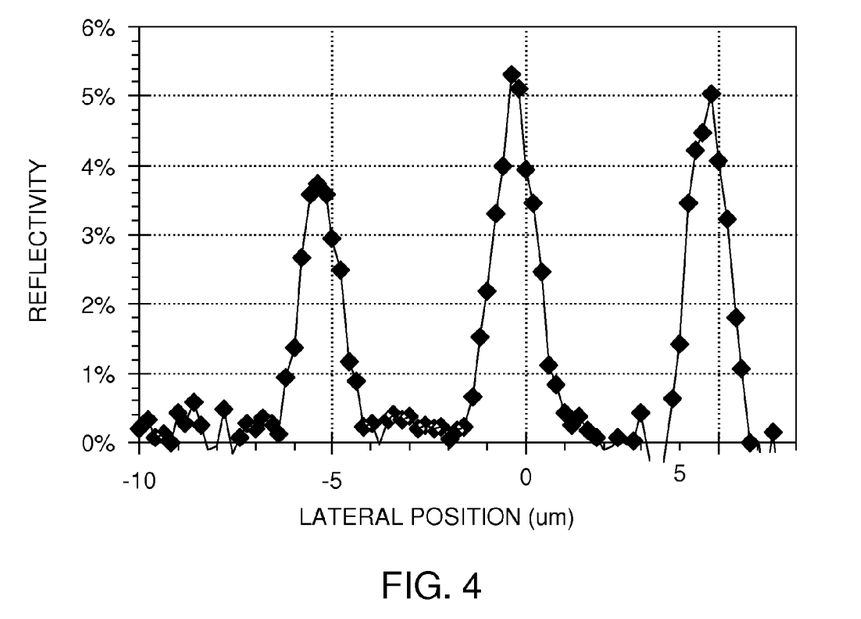
FIG. 4 is a graphical depiction of the reflectivity of an array of microholograms recorded in one embodiment of the optical data storage media.
Figure 5:
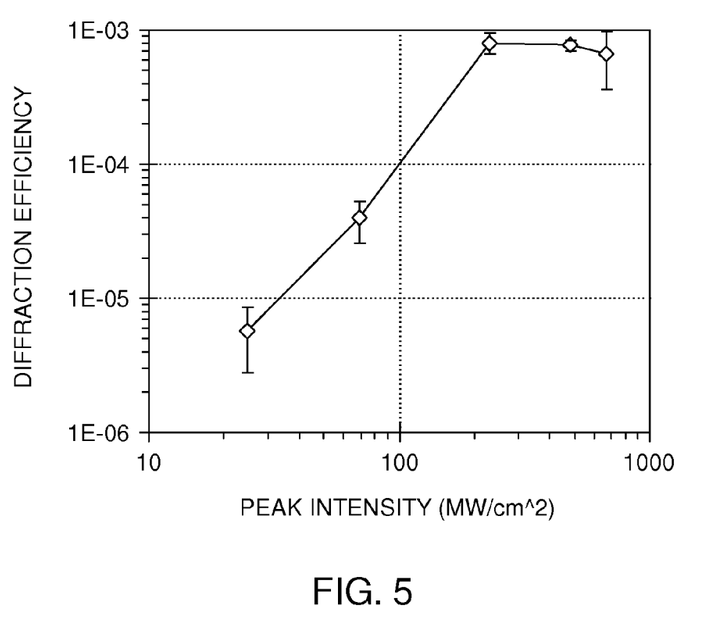
FIG. 5 is a graphical depiction of the diffraction efficiency of one embodiment of the optical data storage medium as a function of intensity for a fixed recording fluence of 60 J/cm$^2$.

Examples 3, 4, 5, and 6 utilize sensitizers functional at approximately 405 nm wavelength, therefore the 405 nm apparatus has been used for their testing. FIG. 4 shows an experimentally measured reflectivity of a series of μ-holograms vs. lateral position of the sample with respect to the readout beam for the optical data storage media prepared according to Example 3. The peaks occur at the positions of the sample when the reference beam is centered on one of the micro-holograms in the array. FIG. 5 shows a dependence of the micro-hologram reflectivity recorded with the same fluence but varied intensity in the optical data storage medium prepared according to Example 4, demonstrating the threshold functionality of the material: material recording sensitivity dramatically increases when the intensity exceeds the threshold value (~100 . . . 200 MW/cm2), while for the sub-threshold intensities, the recorded hologram reflectivity is essentially zero (within the detection limit of the system).

For examples 3, 4, 5 and 6, the following diffraction efficiencies were measured for each (example #'s): 3) D.E of 7.74%; 4) D.E of 1.55%; 5) D.E. of 0.43%; and 6) D.E. of 0.031%.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method, comprising:
   (a) providing an optical data storage medium comprising:
      a polymer matrix other than those functionalized with cinnamates,
      a reactant capable of undergoing a change upon triplet excitation, thereby causing a refractive index change, wherein the reactant comprises a cinnamate, a cinnamate derivative, a cinnamamide derivative, or combinations of these, and
      a non-linear sensitizer capable of absorbing actinic radiation to cause upper triplet energy transfer to said reactant; and
   (b) bit-wise recording a microhologram in said optical data storage medium by irradiating the optical data storage medium with an interference pattern to cause upper triplet energy transfer from the non-linear sensitizer to the reactant, thereby causing the refractive index change, and
   wherein the refractive index change of the medium is at least about 0.005.

2. The method of claim 1, wherein the refractive index change of the medium is at least about 0.05.

3. The method of claim 1, wherein the reactant comprises polyvinylcinnamate (PVCm), polyvinyl 4-chlorocinnamate (PVClCm), polyvinyl 4-methoxycinnamate (PVMeOCm), (2E,2'E)-((1S,2S)-cyclohexane-1,2-diyl)bis(3-phenylacrylate), (2E,2'E)-(1S,2S)-cyclohexane-1,2-diyl)bis(4-chlorophenylacrylate), (2E,2'E)-(1S,2S)-cyclohexane-1,2-diyl) bis(4-methoxyphenyl)acrylate), (2E,2'E)-N,N'-((1S,2S)-cyclohexane-1,2-diyl)bis(3-phenyl)acrylamide (2E,2'E)-N,N'-((1S,2S)-cyclohexane-1,2-diyl)bis(3-(4-chlorophenyl) acrylamide), (2E,2'E)-N,N'-((1S,2S)-cyclohexane-1,2-diyl) bis(3-(4-methoxyphenyl)acrylamide or combinations of these.

4. The method of claim 1, wherein the optical data storage medium further comprises a mediator capable of transferring energy between the non-linear sensitizer and the reactant.

5. The method of claim 4, wherein the mediator comprises acetophenone, dimethylphthalate, benzophenone, 9H-fluorene, biphenyl, phenanthrene, 1-napthonitrile, or combinations of these.

6. The method of claim 1, wherein the non-linear sensitizer comprises a sequential two-photon absorption reverse saturable absorber.

7. The method of claim 6, wherein the non-linear sensitizer comprises a phthalocyanine dye, a subphthalocyanine dye, or an alkynyl platinum dye.

8. The method of claim 7, wherein the optical data storage medium further comprises a photostabilizer.

9. The method of claim 8, wherein the photostabilizer comprises bisdithiobenzil nickel.

10. The method of claim 1, wherein the polymer matrix comprises polyvinylalcohol, poly(alkyl methacrylates), poly (alkyl acrylates), polystyrenes, polycarbonates, poly acrylates, poly(vinylidene chloride), poly(vinyl acetate), or combinations thereof.

11. The method of claim 1, wherein the reactant and non-linear sensitizer are distributed substantially homogenously throughout the polymer matrix.

12. The method of claim 1, wherein the interference pattern comprises an incident radiation having an intensity greater than a threshold value sufficient to cause the refractive index change.

13. An optical data storage medium, comprising:
   a polymer matrix other than those functionalized with cinnamates;
   a reactant comprising a cinnamate, a cinnamate derivative, a cinnamamide derivative, or combinations of these, wherein the reactant is capable of undergoing a change upon triplet excitation, thereby causing a refractive index change; and
   a non-linear sensitizer comprising a reverse saturable absorber capable of absorbing actinic radiation to cause upper triplet energy transfer to said reactant, wherein the non-linear sensitizer comprises a phthalocyanine dye, a subphthalocyanine dye, an alkynyl platinum dye, or combinations of these;
   wherein the optical data storage medium is capable of recording bit-wise microholograms.

14. The optical data storage medium of claim 13, wherein the reactant comprises polyvinylcinnamate (PVCm), polyvinyl 4-chlorocinnamate (PVClCm), polyvinyl 4-methoxycinnamate (PVMeOCm), (2E,2'E)-((1S,2S)-cyclohexane-1,2-diyl)bis(3-phenylacrylate), (2E,2'E)-(1S,2S)-cyclohexane-1,2-diyl)bis(4-chlorophenylacrylate), (2E,2'E)-(1S,2S)-cyclohexane-1,2-diyl)bis(4-methoxyphenyl)acrylate), (2E,2'E)-N,N'-((1S,2S)-cyclohexane-1,2-diyl)bis(3-phenyl)acrylamide (2E,2'E)-N,N'-(1S, 2S)-cyclohexane-1,2-diyl)bis(3-(4-chlorophenyl)acrylamide), (2E,2'E)-N,N'-((1S,2S)-cyclohexane-1,2-diyl)bis(3-(4-methoxyphenyl)acrylamide, or combinations of these.

15. The optical data storage medium of claim 13, further comprising a mediator capable of transferring energy between the non-linear sensitizer and the reactant.

16. The optical data storage medium of claim 15, wherein the mediator comprises acetophenone, dimethylphthalate, benzophenone, 9H-fluorene, biphenyl, phenanthrene, 1-napthonitrile, or combinations of these.

* * * * *